(12) United States Patent
Chen et al.

(10) Patent No.: US 7,261,793 B2
(45) Date of Patent: Aug. 28, 2007

(54) SYSTEM AND METHOD FOR LOW TEMPERATURE PLASMA-ENHANCED BONDING

(75) Inventors: Chien-Hua Chen, Corvallis, OR (US); Paul F. Reboa, Corvallis, OR (US); Tracey B. Forrest, Blodgett, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 554 days.

(21) Appl. No.: 10/917,807

(22) Filed: Aug. 13, 2004

(65) Prior Publication Data

US 2006/0032582 A1    Feb. 16, 2006

(51) Int. Cl.
B29C 65/00    (2006.01)
B32B 37/00    (2006.01)
B32B 38/04    (2006.01)

(52) U.S. Cl. .................. 156/272.6; 156/272.2
(58) Field of Classification Search ............. 156/272.2, 156/272.6; 216/34; 451/37
See application file for complete search history.

(56) References Cited

U.S. PATENT DOCUMENTS

| | | | |
|---|---|---|---|
| 3,288,656 A | 11/1966 | Nakamura | |
| 5,421,953 A * | 6/1995 | Nagakubo et al. | 216/34 |
| 6,042,950 A | 3/2000 | Heau et al. | |
| 6,563,133 B1 | 5/2003 | Tong | |
| 2001/0014514 A1 | 8/2001 | Geusic | |
| 2003/0020915 A1 | 1/2003 | Schueller et al. | |
| 2003/0087110 A1 | 5/2003 | Furusawa et al. | |
| 2003/0145940 A1 | 8/2003 | Chaudhury et al. | |
| 2003/0211705 A1 | 11/2003 | Tong et al. | |
| 2004/0033639 A1 | 2/2004 | Chinn et al. | |
| 2004/0038536 A1 * | 2/2004 | Zhang et al. | 438/694 |
| 2004/0043404 A1 * | 3/2004 | Saraf | 435/6 |
| 2004/0058476 A1 * | 3/2004 | Enquist et al. | 438/114 |
| 2004/0091688 A1 * | 5/2004 | Gaku et al. | 428/209 |
| 2004/0126993 A1 * | 7/2004 | Chan et al. | 438/455 |
| 2004/0171196 A1 * | 9/2004 | Walitzki | 438/137 |
| 2004/0235311 A1 * | 11/2004 | Nakanishi et al. | 438/775 |
| 2004/0241958 A1 * | 12/2004 | Guarini et al. | 438/455 |
| 2005/0079712 A1 * | 4/2005 | Tong et al. | 438/689 |
| 2005/0104036 A1 * | 5/2005 | Tork et al. | 252/299.01 |
| 2005/0158999 A1 * | 7/2005 | Lin et al. | 438/687 |

* cited by examiner

*Primary Examiner*—Richard Crispino
*Assistant Examiner*—Pedram Parvini

(57) ABSTRACT

A method for bonding a plurality of substrates includes performing a gas plasma treatment on the plurality of substrates, and performing a water plasma treatment on the plurality of substrates. Additionally, a system for performing low temperature plasma enhanced bonding includes a substrate housing structure having a substrate receiving volume, a gas source fluidly coupled to the substrate housing structure, a water vapor source fluidly coupled to the substrate housing structure, and a radio-frequency (RF) generator coupled to the substrate housing structure, wherein the system is configured to perform both a gas plasma treatment and a water plasma treatment on a substrate.

22 Claims, 5 Drawing Sheets

SYSTEM AND METHOD FOR LOW TEMPERATURE PLASMA-ENHANCED BONDING

BACKGROUND

A number of bonding techniques are known for joining semiconductor substrates including intermediate-layer bonding (such as adhesive, glass frit, or solder), anodic bonding, thermal compression bonding, fusion bonding, etc. The selection of a bonding technique to be used for specific substrates may vary depending on thermal budget, hermeticity requirements, properties of the bond interface, and so on.

Fusion bonding can join two substrates without an intermediate layer; however, fusion bonding includes using high annealing temperatures that approach 900 degrees Celsius to achieve good bond strength. Due to the high temperature requirement, fusion bonding is limited to a few niche applications such as silicon-on-insulator (SOI) substrate fabrication, limited MEMS assembly, etc. The high temperatures used in fusion bonding is not compatible with complementary metal oxide semiconductor (CMOS) devices.

In contrast to fusion bonding, plasma-activation of semiconductor bonding surfaces enables direct covalent bonding at significant lower temperatures and has found applications from silicon-on-insulator (SOI) substrate fabrication to 3-dimensional substrate stacking. The traditional plasma surface activation process involves polished bond interfaces receiving a brief $O_2$ or $N_2$ plasma treatment followed by a wet-dip process in a standard clean one (SC1) or de-ionized water bath. The post-plasma wet dip process step increases the bond strength of the plasma enhanced bonding. Unfortunately, the post-plasma wet-dip process is not compatible with most MEMS devices or substrates that include desiccants which cannot generally be exposed to water. More specifically, the traditional post-plasma wet-dip process increases the likelihood of problems in the MEMS due to stiction.

One alternative to the traditional post-plasma wet-dip process is to hydrate the plasma treated interface by exposing it to ambient for an extended period of time. However, this approach in general is difficult to control and the bond interface can react with contaminants in air which degrade the bonding surface energy.

SUMMARY

A method for bonding a plurality of substrates includes performing a gas plasma treatment on the plurality of substrates, and performing a water plasma treatment on the plurality of substrates.

Similarly, a system for performing low temperature plasma enhanced bonding includes a substrate housing structure having a substrate receiving volume, a gas source fluidly coupled to the substrate housing structure, a water vapor source fluidly coupled to the substrate housing structure, and a radio-frequency (RF) generator coupled to the substrate housing structure, wherein the system is configured to perform both a gas plasma treatment and a water plasma treatment on a substrate.

BRIEF DESCRIPTION OF THE DRAWINGS

The accompanying drawings illustrate various embodiments of the present system and method and are a part of the specification. The illustrated embodiments are merely examples of the present system and method and do not limit the scope thereof. The summary as well as other features and aspects of the present system and method will become apparent upon reading the following detailed description and upon reference to the drawings in which.

Throughout the drawings, identical reference numbers designate similar, but not necessarily identical, elements.

DETAILED DESCRIPTION

The present specification describes a system and a method for low temperature plasma-enhanced bonding of substrates. More specifically, the present system and method provide for plasma treating and bonding two or more substrates in ambient without a wet treatment. In addition to performing an $O_2$ or $N_2$ plasma treatment on the substrates to be bonded, a few mono-layers of water are also deposited by a low-power water plasma treatment, thereby eliminating the need for a post plasma wet dip process. The following specification and claims disclose exemplary embodiments for performing the above-mentioned system and method.

As used in this specification and the appended claims, the term "Micro-Electro Mechanical System" or "MEMS" is meant to be understood broadly as describing any very small (micro) mechanical device that may be constructed on one or more semiconductor chips and which may be fabricated using integrated circuit (IC) batch-processing techniques. MEMS may be broadly classified as sensors, actuators, a combination of sensors and actuators, or added circuitry for processing or control. For the purposes of present specification and appended claims, the term MEMS is meant to refer to any of the above-mentioned classes.

Additionally, as used in the present specification and in the appended claims, the term "desiccant" is meant to be understood as referring to any substance that promotes drying, including, but in no way limited to, calcium oxide. A desiccant is often included in MEMS to prevent the accumulation of moisture which may result in stiction of the individual MEMS components.

"Stiction" is one of the key causes of low yield in the fabrication of MEMS devices and is believed to result from a number of sources, some of the most significant being capillary forces, surface contaminants, van der Waals forces, and electrostatic attraction. Factors which may contribute to stiction include, but are in no way limited to, high surface tension liquids like water that induce collapse of nearby surfaces through large capillary forces.

In the following specification, for purposes of explanation, numerous specific details are set forth in order to provide a thorough understanding of the present system and method for performing low temperature plasma-enhanced bonding of substrates. It will be apparent, however, to one skilled in the art, that the present method may be practiced without these specific details. Reference in the specification to "one embodiment" or "an embodiment" means that a particular feature, structure, or characteristic described in connection with the embodiment is included in at least one embodiment. The appearance of the phrase "in one embodiment" in various places in the specification are not necessarily all referring to the same embodiment.

Exemplary Structure

Figure 1A:
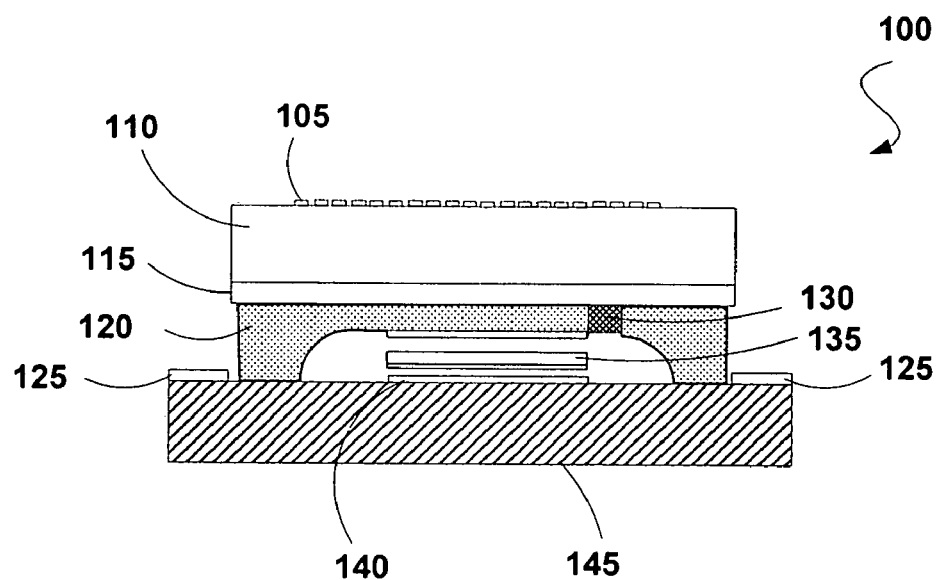
FIGS. 1A and 1B are side views of simple block diagrams illustrating the components of exemplary MEMS configurations, according to a number of exemplary embodiments.
Figure 1B:
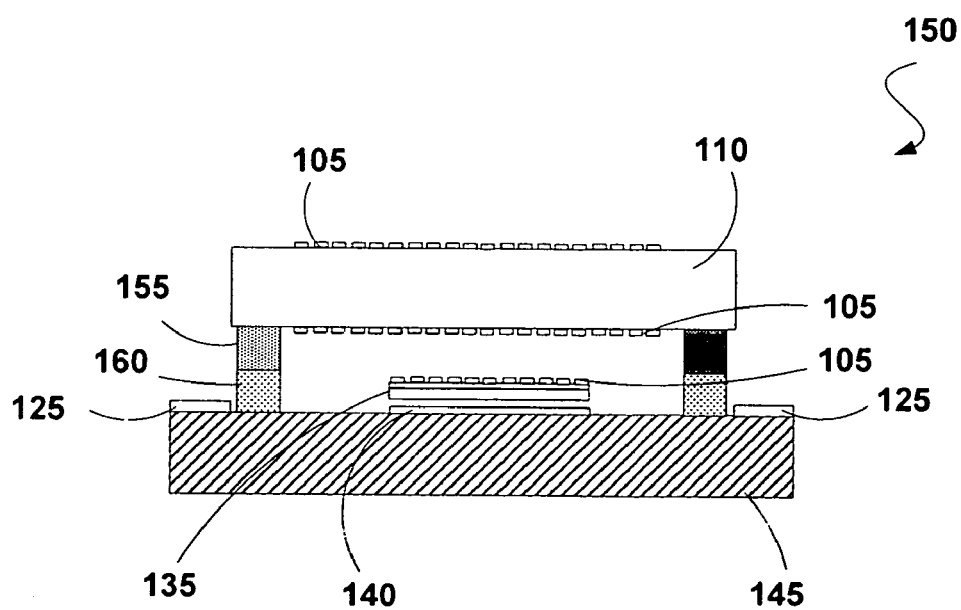

FIGS. 1A and 1B illustrate a number of exemplary MEMS structures that include one or more bonded interfaces. As illustrated in FIG. 1A, an optical MEMS structure (100) may include a base substrate (145) supporting a number of elements, such as contact pads (125), an electrode (140), a pixel plate (135) disposed adjacent to the electrode, and a tetraethylorthosilicate silicon-oxide (TEOS) member (120) formed on the base substrate. A bond material (115) and a glass lid (110) are bonded to the TEOS member (120). Additionally, an anti-reflective coating (105) may be formed on the glass lid (110) to enhance the optical properties of the MEMS device (100). FIG. 1A also illustrates a dielectric plug (130) disposed in the TEOS member (120) to prevent moisture from contacting and affecting the internal components of the MEMS structure (100) such as the pixel plate (135). As illustrated in FIG. 1A, a number of the MEMS structure (100) components are bonded together, and consequently, will benefit from the present system and method.

Similarly, FIG. 1B illustrates an optical MEMS device (150) including a number of components similar to those illustrated in FIG. 1A. For example, the optical MEMS device (150) illustrated in FIG. 1B includes a base substrate (145), a glass lid (110), a pixel plate (135), a number of contact pads (125), and an electrode (140). Moreover, as illustrated in FIG. 1B, an anti-reflective coating (105) is formed on both sides of the glass lid (110) and on the pixel plate (135). Additional anti-reflective coating (105) is incorporated in the optical MEMS device (150) of FIG. 1B due to the larger gap between the pixel plate (135) and the glass lid (110).

In addition to the components described above, the optical MEMS device (150) illustrated in FIG. 1B utilizes a plurality of bond rings (155, 160) that operate as the bonding interfaces between component layers. As shown in FIG. 1B, the bond ring optical MEMS device (150) includes a number of interfaces that are bonded, and consequently may benefit from the present system and method. As illustrated in FIG. 1B, the interface between bond rings (155, 160) is one exemplary bond interface that may be bonded to enhance the strength of the resulting MEMS (150). While the exemplary optical MEMS device (150) is illustrated In FIG. 1B as having identical bond ring (155, 160) dimensions, the present system and method have been used to build successful hermetic packages using 300 um, 600 um, and 1000 um wide TEOS bond rings. Additionally, the present system and method may be used to bond substrates made of any number of materials including, but in no way limited to, TEOS, glass, aluminum alloys, silicon alloys, and the like.

As mentioned previously, the traditional post-plasma wet dip process is performed to increase bond strength of the plasma treated interface. However, the post-plasma wet dip process may cause stiction to occur in most MEMS devices and be incompatible with structures containing a desiccant.

However, the present system and method take advantage of reactive water plasma to deposit a few mono-layers of $H_2O$ after or during the treating of the surface with $N_2$, $O_2$, or another plasma, thereby eliminating the need for the previously performed post-plasma wet dip process. In other words, in addition to $O_2$ or $N_2$ plasma, a source for water vapor can also be added to the plasma chamber allowing both the surface activation and hydrophilization processes to be accomplished in a single chamber pump down. The combination of $O_2$ or $N_2$ and water plasma process described in the present system and method not only increases activates the Si bonding sites density on the bonding interface of a substrate but also hydrates the bonding sites to form silanol (SiOH) groups, which in turn form numerous siloxane bonds between two bond interfaces, as will be described in further detail below.

Exemplary System

Figure 2:
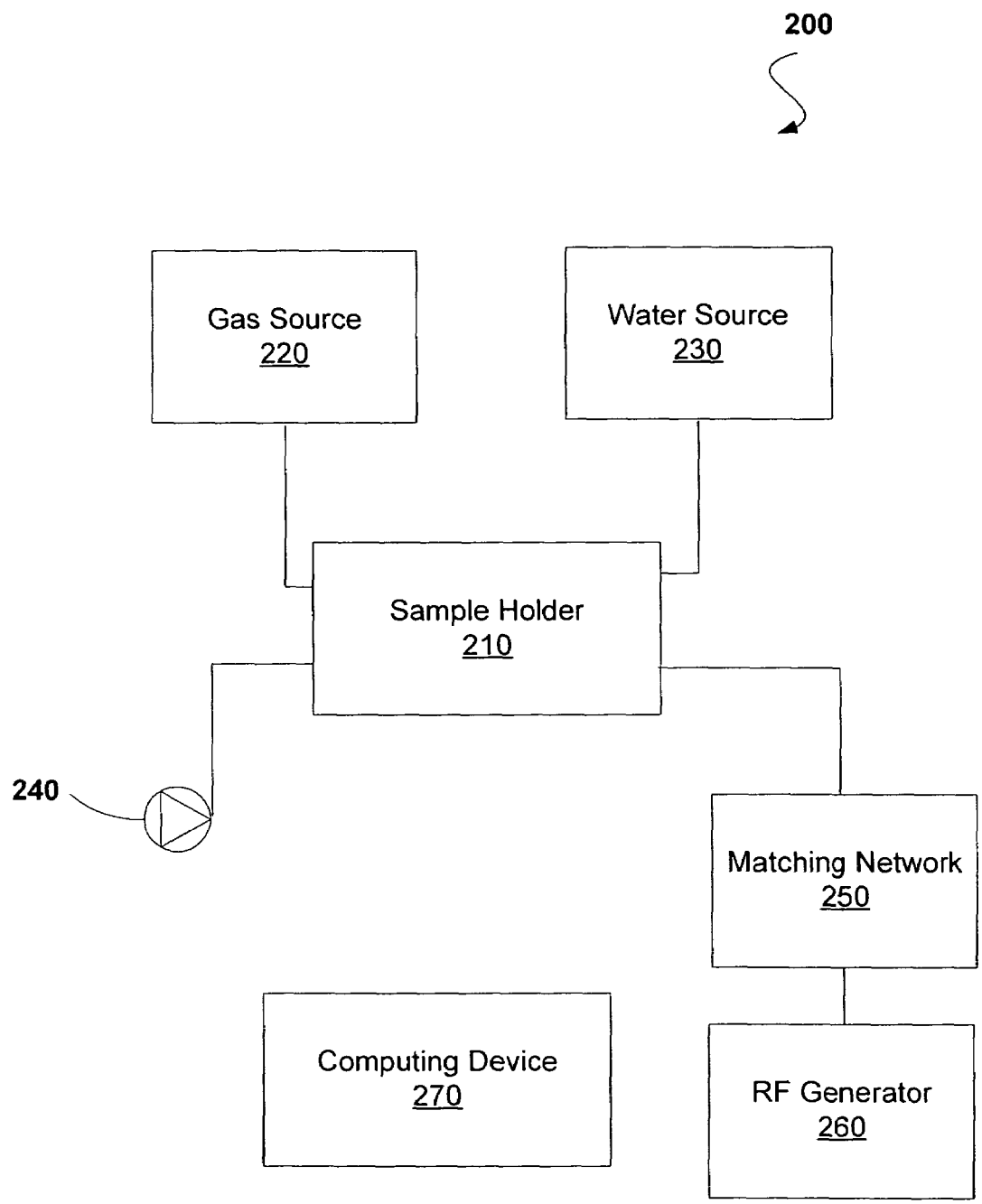
FIG. 2 is a block schematic illustrating a plasma processing system, according to one exemplary embodiment.

FIG. 2 is a simple block diagram illustrating a plasma processing system (200) that may be used to perform low temperature bonding with plasma activation and hydration, according to one exemplary embodiment. As illustrated in FIG. 2, the plasma processing system (200) generally includes a sample holder (210) coupled to a gas source (220) and a water vapor source (230). Additionally, a vacuum pump (240) is fluidly coupled to the sample holder (210). Moreover, the plasma processing system (200) generally includes a radio frequency (RF) generator (260) coupled to the sample holder (210) via a matching network (250). In addition, a second RF generator (not shown) can also be used to generate high density plasma upstream in addition to the above-mentioned generator (260). According to this exemplary embodiment, the gas or water plasma and substrate bias can be controlled independently. Further details of the individual components of the present plasma processing system (200) will be given below.

According to the exemplary embodiment illustrated in FIG. 2, the sample holder (210) may be any structure that includes a substrate receiving volume which may be defined, according to one exemplary embodiment, by walls, a bottom, and a lid assembly. The sample holder (210) is configured to provide access to the volume such that one or more substrates may be passed into and out of the volume. Optionally, the substrate may be passed into and out of the volume on a carrier that travels with the substrate during processing. Additionally, the volume may include a temperature control device configured to control the temperature of the sample holder (210) during processing.

The gas source (220) illustrated in FIG. 2 is fluidly coupled to the substrate receiving volume of the sample holder (210). The gas source (220) is configured to provide gas to the substrate receiving volume. The gas source (220) may contain any number of desired gasses to be provided and used for performing a plasma activation process on a desired substrate, as is well known in the art. According to one exemplary embodiment, the gas source (220) may be configured to supply any number of gases to the substrate receiving including, but in no way limited to, $N_2$, $O_2$, air, and/or argon.

Similarly, the water source (230) illustrated in FIG. 2 is configured to provide a specified quantity of water ($H_2O$) vapor to the substrate receiving volume of the sample holder (210). According to one exemplary embodiment, a number of valves and/or conduits (not shown) may be associated with the water source (230) to control the selective deposit of water into the sample holder (210). A specified quantity of water vapor may be transferred from the water source (230) to the sample holder either during, or after a plasma activation process, as will be described in further detail below with reference to FIG. 3.

Continuing with FIG. 2, the vacuum pump (240) may be fluidly coupled to the substrate receiving volume of the sample holder (210) through an exhaust port. Additionally, a shut-off valve/throttle valve (not shown) may be disposed between the vacuum pump (240) and the sample holder (210) to selectively isolate the vacuum pump (240) from the substrate receiving volume and to regulate the pressure therein when in use. The vacuum pumping (240) may regulate the pressure within the sample holder (210) and/or evacuate gasses from the chamber during the substrate processing.

According to one exemplary embodiment illustrated in FIG. 2, RF power is supplied to the sample holder (210) by an RF generator (260) to excite the gases disposed in the substrate receiving volume of the sample holder. The RF power from the RF generator (260) is generally selected commensurate with the size of the sample holder (210). Typically, a matching network (250) is coupled between the RF generator (260) and the sample holder (210) to match the impendence of the plasma and thus couple the RF power to the plasma more effectively.

Additionally, any number of computing devices (270) may be controllably coupled to the above-mentioned components of the plasma processing system. Accordingly, the computing device (270) may control the distribution of gas and/or water vapor from their respective sources (220, 230), control the RF power provided, and control the operation of the vacuum pump (240). Additionally, any number of servo mechanisms may be associated with the plasma processing system (200) to automate the present system and method.

Exemplary Implementation and Operation

According to one exemplary embodiment, the plasma processing system (200) illustrated in FIG. 2 is used to treat a bond interface with water plasma in conjunction with $O_2$ or $N_2$ plasma to hydrate the bond interface for plasma-enhanced bonding. The water plasma treatment can be performed during, or after the $N_2$ or $O_2$ plasma activation process. Consequently, the traditionally used post-plasma wet treatment process is eliminated while still maintaining a good bond surface energy, making the present system and method well-suited to MEMS applications and applications including desiccants.

Figure 3:
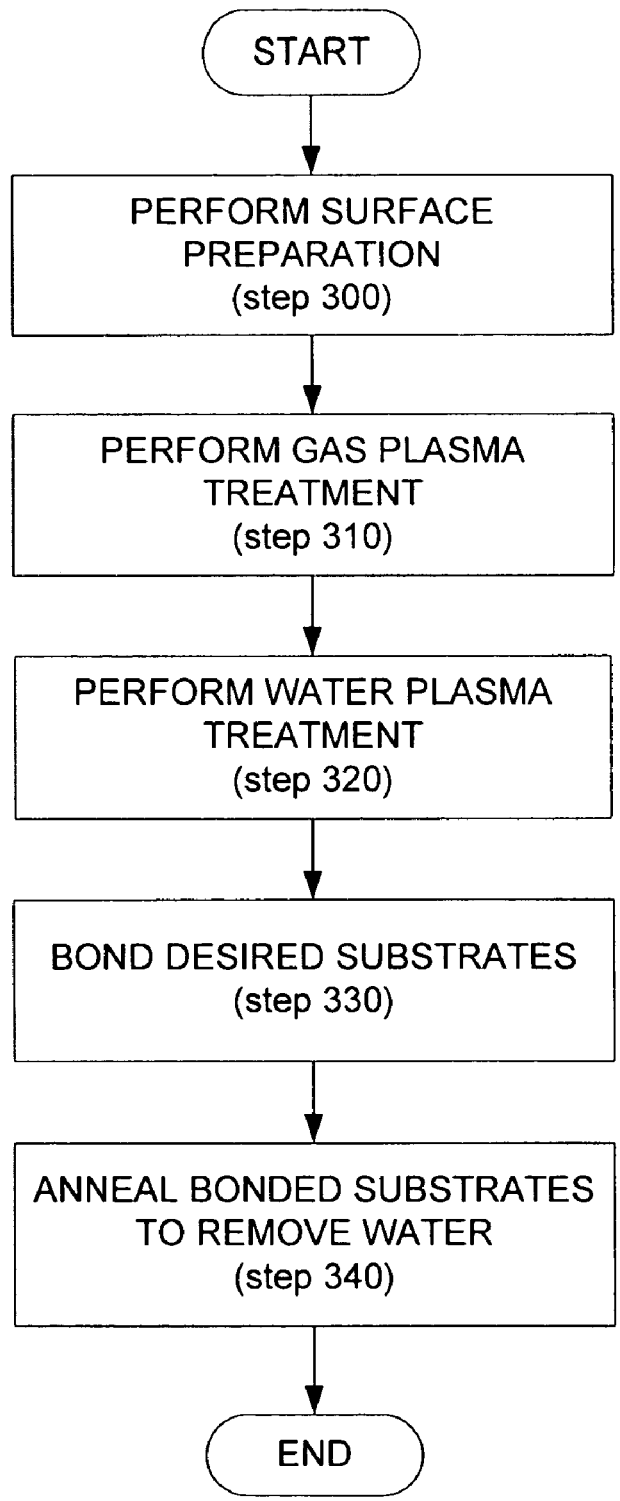
FIG. 3 is a simple block diagram illustrating a method for bonding substrates using low temperature plasma activation and hydration, according to one exemplary embodiment.

Referring now to FIG. 3, an exemplary method for bonding a plurality of substrates with plasma activation and hydration is illustrated. As shown in FIG. 3, the present exemplary method begins by first performing surface preparation of the substrates to be bonded, such as a chemical mechanical planarization process (step 300). Once the surface of the substrates to be bonded has been prepared, a gas plasma treatment, such as $N_2$ or $O_2$, is performed on the surface of the substrate (step 310). After or simultaneously with the performance of the gas plasma treatment, a water plasma treatment is also performed (step 320) and the desired substrate surfaces are bonded (step 330). Once bonded, the substrates are processed according to an annealing process (step 340) to complete the bond. Further detail of the above-mentioned exemplary bonding method will be given below with reference to FIGS. 4 through 5C, followed by a description of a test apparatus used to test bond strength.

As illustrated in FIG. 3, the present method begins by performing a surface preparation process on the substrates to be bonded (step 300). According to one exemplary embodiment, chemical mechanical planarization (CMP) may be performed. Smoothing the bond interface to a high degree of smoothness, such as less than 20 A rms over a 2 um×2 um area, improves the strength of the bond produced. While CMP is one exemplary surface treatment method that may be used to smooth the surfaces of the substrates to be bonded, any number of surface treatment methods well known in the art may be performed prior to the bonding of substrates, according to the present exemplary method.

Once the surfaces are prepared (step 300), a gas plasma treatment is performed on the desired surfaces. The main purpose of the gas plasma treatment is to increase the density of chemical interface species, such as dangling silicon (Si) bonds, etc., which in turn enhance the resulting bond between the surfaces. According to one exemplary embodiment, plasma activation may increase silanol group density on the SiO2 interface with proper plasma treatment. Gas plasma treatments are currently known in the art and may be performed in the sample holder (210; FIG. 2) by the introduction of an externally generated plasma, such as inductively-coupled plasma from upstream, or can be generated right above the substrate under RIE mode (reactive ion etch) by the simultaneous introduction of a desired gas and RF power. As mentioned previously, the plasma treatment may be performed using any number of gases including, but in no way limited to, $N_2$, $O_2$, argon, air, and appropriate combinations thereof.

Upon completion of, or simultaneously with the gas plasma treatment (step 310), a water plasma treatment is performed on the desired surfaces (step 320). According to one exemplary embodiment, a water plasma treatment of approximately 200 seconds may be performed to hydrate the surface of a desired bond surface. Upon completion of the 200 sec. water plasma treatment (step 320), a couple of mono-layers of water molecules will be present on the bond interface, thereby sufficiently hydrating the bond interface for an effective plasma activated bonding. As a result of the hydration of the bond interface, a number of water hydrogen bonds are formed on the desired bond surface interface.

Once both of the desired bond surfaces have received a gas plasma treatment (step 310) and the water plasma treatment (step 320), the substrates are bonded (step 330). As the treated bond interfaces are brought together, the water molecules deposited during the water plasma treatment (step 310) create hydrogen bonds that bridge the gap between the two interfaces until the interfacial water molecules are driven out from the interface during the annealing process. Without the help of water molecules at bond interface, the two bond interfaces need to be polished to higher degree of smoothness for plasma activated bonding to work since there is nothing to bridge the gap between the surfaces initially. Upon driving out of the interfacial water molecules, the gap separating the two substrates closes and the bond interfaces start to make contact and form numerous siloxane bonds as will be described in further detail below with reference to FIGS. 4 through 5C.

Figure 4:
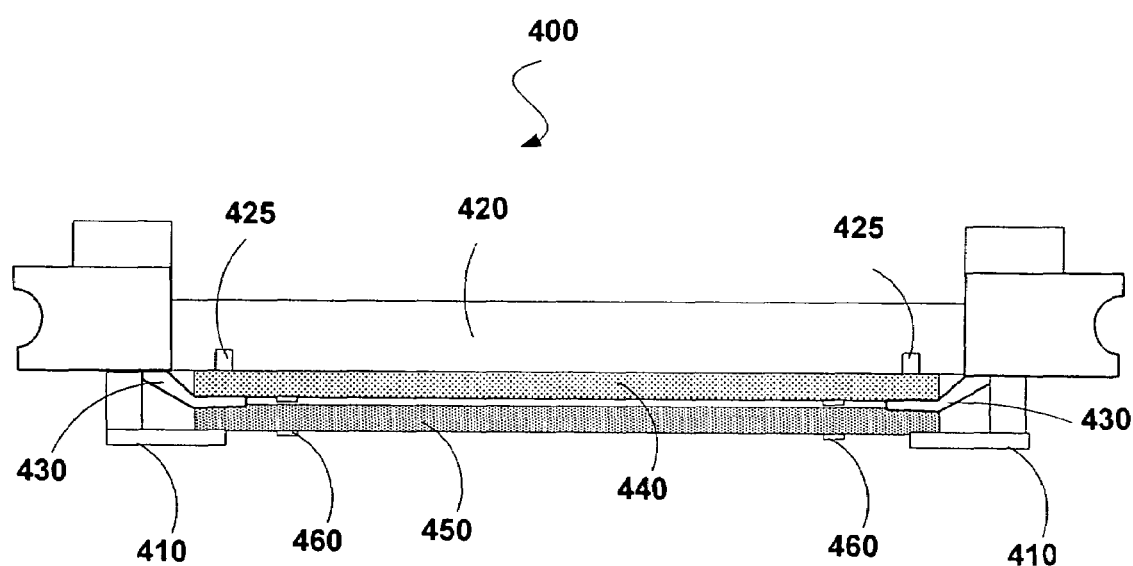
FIG. 4 is a side view of a plurality of substrates being joined in a bond tool, according to one exemplary embodiment.

According to one exemplary embodiment illustrated in FIG. 4, a bond tool (400) is used to align and clamp two mating substrates (440, 450). The bond tool (400) may then be transferred to a bonder for final bonding and annealing processes (step 340; FIG. 3). As shown in FIG. 4, the bond tool (400) includes a base (420) having a number of vacuum grooves (425) formed therein. A number of clamps (410) hold down substrates with flags (430) disposed in between to prevent two mating substrates from contacting each other.

As illustrated in FIG. 4, bonding the substrates (step 330; FIG. 3) includes loading a first substrate (440) onto the base (420) where it is held to the bond tool (400) via the application of a vacuum in the vacuum groove (425). A pair of objective lenses (not shown) may then look upward to search for alignment keys (460) on the first substrate (440). As soon as the alignment is completed, the objective lenses are locked in place and a plurality of flags (430) slide onto the edge of the first substrate (440) as shown in FIG. 4. According to one exemplary embodiment, the flags (430) are approximately 50 um thick to prevent the two mating substrates from contacting each other during alignment of the second substrate (450) and bond tool (400) transfer processes.

Once the first substrate (440) is aligned and locked in place, the second substrate (450) is loaded on the other side of flags (430), aligned to the first substrate using the alignment keys (460), and clamped to the bond tool (400) using the clamps (410). Once the substrates (440, 450) are clamped to the bond tool (400), the bond tool and its coupled substrates may be transferred to a bonder for final bonding and annealing processes (step 340; FIG. 3).

Once mounted in a bonder, a vacuum is created and thermal energy is generated as a bow pin forces the center of two mating substrates to contact each other while the flags (430) are removed and the first substrate (440) and the second substrate (450) are allowed to make contact.

Figure 5A:
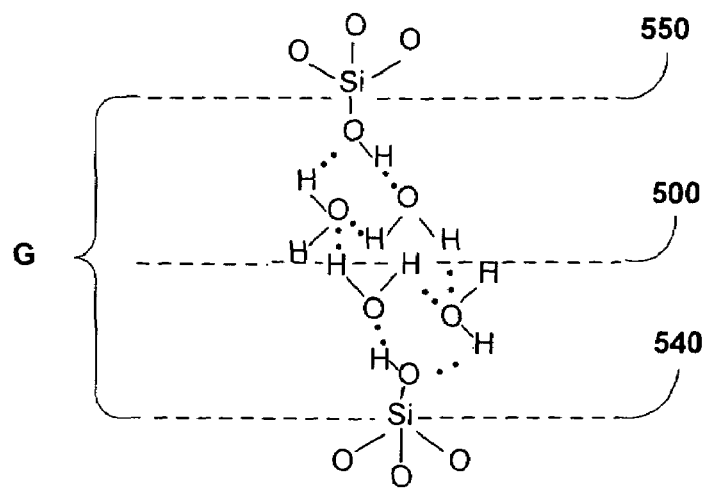
FIGS. 5A through 5C are chemical structures illustrating a reaction that occurs at a bonding interface, according to one exemplary embodiment.
Figure 5B:
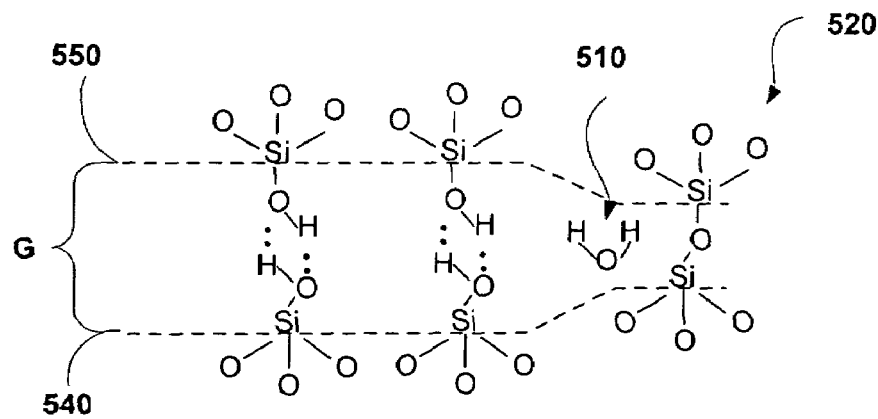
Figure 5C:
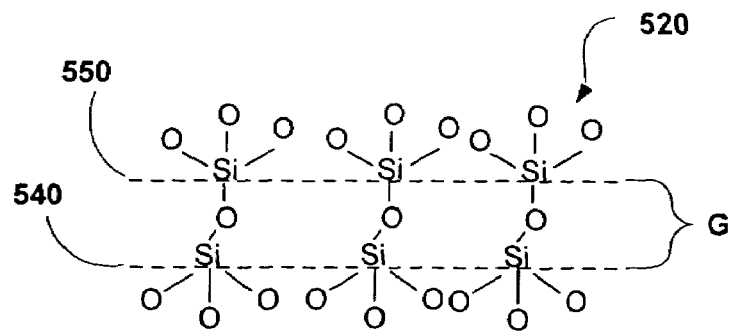

FIGS. 5A through 5C illustrate the reactions that take place once the first and second substrates (440, 450) are bonded and annealed. As illustrated in FIG. 5A, the surfaces (540, 550) of the first and second substrates (440, 450; FIG. 4) are hydrophilic and terminated with an —OH group. When the first (550) and second (540) hydrophilic surfaces are brought into contact at room temperature, the substrates (440, 450; FIG. 4) bond spontaneously and are held together with hydrogen bonds at the bonding interface (500). According to one exemplary embodiment, the interface gap (G) between the first surface (550) and the second surface (540) is less than 50 A (Angstroms).

As the annealing temperature in the bonder increases to 110° C. and above, water molecules (510) start to leave the bonding interface (500) by diffusing out of the substrates (440, 450; FIG. 4) through the bond interface or by diffusing through native oxide to react with the silicon substrate. With the absence of water, stronger siloxane bonds (520) start to form:

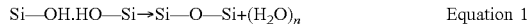

Equation 1 as shown in the FIG. 5B. As the water molecules (510) diffuse out of the bond interface (500), silanol groups turn into numerous siloxane bonds (520) between the substrate surfaces (540, 550), thereby reducing the gap (G) between the first surface and the second surface. As illustrated in FIG. 5C, once substantially all of the water molecules (510; FIG. 5B) are driven from the bond interface (500; FIG. 5A), numerous siloxane bonds (520) are formed along the bond interface. Accordingly, high surface energy can be achieved between the two substrates (440, 450; FIG. 4) at low temperatures. According to one exemplary embodiment, the surface energy of the hydrophilic $Si/SiO_2$ interface reaches 2 j/m^2 or better at 200° C.

While the present exemplary embodiment has been described and illustrated above, the order of the exemplary method may be modified. By way of example only, the gas plasma treatment (step 310) and the water plasma treatment (step 320) may be interchanged, etc.

Strength Testing

Contact angle is a common way to evaluate the wettability as well as a good indication of high silanol group density on a surface. According to one exemplary embodiment, a silicon (Si) coupon went through both an $N_2$ plasma acti- vation and water plasma treatment and was then tested for surface wettability using the contact angle. Water plasma significantly improved the wettability of the Si test coupons. In contrast to the Si coupon that was not treated, which has a contact angle of 43 degrees, the sample with 240 sec. water plasma treatment reduced the contact angle to between approximately 1-5 degrees, indicating that water plasma works very effectively to hydrophilize the $N_2$ plasma-treated Si surface and thus increase the silanol group density there significantly.

Additionally, shear tests have been performed on die packages with plasma enhanced bonding. In general, the shear strength of a die package with plasma-activated bonding is comparable to the package with Au80Sn20 solder bonding.

Moreover, the hermeticity of die packages with plasma-enhanced bonding was evaluated at Sigma Test Lab with Radioisotope leak test (Krypton-85). The packages were pressurized in a chamber with radioactive Krypton-85 and nitrogen mixture for six hours. The penetration of the Kr-85 into the non-hermetic die package is measured by detection of gamma rays emitted through the walls of the package. Based on the results of Kr-85 leak test, packages with plasma-enhanced bonding have leak rate of <5*10-10 atm.cc/sec, which is significantly better than the leak rate rejection limit of 5*10-8 atm.cc/sec called out by the MIL-STD-883E Hermeticity Standard.

While the present system and method have been described, for ease of explanation only, in the context of an optical MEMS, the present systems and methods may be applied to any number of substrate bonding arrangements including, but in no way limited to, MEMS hermetic packaging, direct glass bonding to optical MEMS substrates, Thermal Ink-Jet assembly, and the like. Moreover, the present systems and methods may be used to bond any number of bond interfaces including, but in no way limited to, silicon (Si), silicon dioxide ($SiO_2$), TEOS, Quartz, Corning 1737 glass, indium phosphide (InP), Sapphire, Si carbide, Polyimide, and other similar materials.

In conclusion, the present system and method eliminate the post-plasma wet treatment traditionally used when performing plasma enhanced bonding. By including a step of performing a water plasma treatment prior to bonding a pair of desired wafers, the present system and method enable low temperature plasma-enhanced bonding of MEMS, eliminates the needs of post-plasma treatment process to rinse and dry substrates, eliminates the wet-dip process which is not compatible with MEMS or desiccant materials, and provides better control over the surface hydration with reactive water plasma.

The preceding description has been presented only to illustrate and describe exemplary embodiments of the present system and method. It is not intended to be exhaustive or to limit the system and method to any precise form disclosed. Many modifications and variations are possible in light of the above teaching. It is intended that the scope of the system and method be defined by the following claims.

What is claimed is:

1. A method for bonding a plurality of substrates comprising:
performing a gas plasma treatment on said plurality of substrates;
performing a water plasma treatment on said plurality of substrates by introducing a quantity of water vapor into a substrate housing and introducing radio-frequency power to said substrate housing sufficient to generate a water plasma to hydrate a surface of each of said plurality of substrates; and physically joining said plurality of substrates.

2. The method of claim 1, wherein said gas plasma treatment comprises one of $N_2$, $O_2$, argon, or air.

3. A method for bonding a plurality of substrates comprising:

performing a gas plasma treatment on said plurality of substrates; and performing a water plasma treatment on said plurality of substrates wherein said water plasma treatment is configured to hydrate a surface of each of said plurality of substrates to form a silanol group and to hydrate a surface of each of said plurality of; and physically joining said plurality of substrates.

4. The method of claim 3, wherein said silanol groups form siloxane bonds between said plurality of substrates.

5. The method of claim 1, wherein said water plasma treatment is performed simultaneously with said gas plasma treatment.

6. The method of claim 1, wherein said water plasma treatment is performed after said gas plasma treatment.

7. The method of claim 1, further comprising annealing said joined plurality of substrates.

8. The method of claim 1, further comprising smoothing a surface of each of said plurality of substrates.

9. The method of claim 8, wherein said smoothing a surface of each of said plurality of substrates comprises performing a chemical mechanical planarization operation on said plurality of substrates.

10. The method of claim 1, wherein said gas plasma treatment is configured to increase a density of chemical interface species on a surface of said plurality of substrates.

11. The method of claim 10, wherein said chemical interface species comprises one of a silanol group or silicon dangling bond.

12. The method of claim 1, wherein said plurality of substrates comprise a desiccant.

13. The method of claim 1, wherein said plurality of substrates comprise a micro-electro mechanical system.

14. A method for bonding a plurality of substrates comprising:

smoothing a surface of each of said plurality of substrates;

performing a gas plasma treatment on said plurality of substrates to increase a density of chemical interface species on a surface of said plurality of substrates, said gas plasma treatment including one of $N_2$, $O_2$, argon, or air, performing a water plasma treatment on said plurality of substrates by introducing a quantity of water vapor into a substrate housing and introducing radio-frequency power to said substrate housing sufficient to generate a water plasma to hydrate a surface of each of said plurality of substrates;

physically joining said plurality of substrates; and annealing said joined plurality of substrates.

15. A method for bonding a plurality of substrates comprising:

smoothing a surface of each of said plurality of substrates;

performing a gas plasma treatment on said plurality of substrates to increase a density of chemical interface species on a surface of said plurality of substrates, said gas plasma treatment including one of $N_2$, $O_2$, argon, or air performing a water plasma treatment on said plurality of substrates wherein said water plasma treatment is configured to form a silanol group and to hydrate a surface of each of said plurality of substrates to form a silanol group on a surface of each of said plurality of substrates;

physically joining said plurality of substrates; and annealing said joined plurality of substrates.

16. The method of claim 15, wherein said silanol groups form siloxane bonds between said plurality of substrates.

17. The method of claim 14, wherein said water plasma treatment is performed simultaneously with said gas plasma treatment.

18. The method of claim 14, wherein said smoothing a surface of each of said plurality of substrates comprises performing a chemical mechanical planarization operation on said plurality of substrates.

19. The method of claim 14, wherein said chemical interface species comprises one of a silanol group or a silicon (Si) dangling bond.

20. A method for bonding a plurality of substrates comprising:

performing a gas plasma treatment on said plurality of substrates;

performing a water plasma treatment on said plurality of substrates;

wherein said water plasma treatment is temporally sufficient to substantially form a pair of mono-layers of water molecules on said plurality of substratres; and physically joining said plurality of substrates.

21. The method of claim 20, wherein said water plasma treatment is performed for approximately 200 seconds.

22. The method of claim 20, wherein said performing a water plasma treatment on said plurality of substrates comprises:

introducing a quantity of water vapor into a substrate housing; and introducing radio-frequency power to said substrate housing sufficient to generate a water plasma to hydrate a surface of each of said plurality of substrates.

* * * * *

UNITED STATES PATENT AND TRADEMARK OFFICE
CERTIFICATE OF CORRECTION

PATENT NO.         : 7,261,793 B2                                          Page 1 of 1
APPLICATION NO.    : 10/917807
DATED              : August 28, 2007
INVENTOR(S)        : Chien-Hua Chen et al.

It is certified that error appears in the above-identified patent and that said Letters Patent is hereby corrected as shown below:

In column 9, line 15, in Claim 3, after "plurality of" insert -- substrates --.

In column 10, line 41, in Claim 20, delete "substratres" and insert -- substrates --, therefor.

Signed and Sealed this

Eleventh Day of November, 2008

JON W. DUDAS
*Director of the United States Patent and Trademark Office*